United States Patent
Ni (10) Patent No.: US 9,018,727 B2
(45) Date of Patent: Apr. 28, 2015

(54) INGAAS PHOTODIODE ARRAY (75) Inventor: Yang Ni, Palaiseau (FR)

(73) Assignee: New Imaging Technologies, Verrieres le Buisson (FR)

( * ) Notice: Subject to any disclaimer, the term of this patent is extended or adjusted under 35 U.S.C. 154(b) by 0 days.

(21) Appl. No.: 14/131,897

(22) PCT Filed: Jul. 11, 2012

(86) PCT No.: PCT/EP2012/063596
§ 371 (c)(1),
(2), (4) Date: Apr. 17, 2014

(87) PCT Pub. No.: WO2013/007753
PCT Pub. Date: Jan. 17, 2013

(65) Prior Publication Data
US 2014/0217543 A1    Aug. 7, 2014

(30) Foreign Application Priority Data

Jul. 11, 2011   (FR) ..................... 11 56290

(51) Int. Cl.
*H01L 27/146*   (2006.01)
*H01L 31/103*   (2006.01)
*H01L 31/18*    (2006.01)

(52) U.S. Cl.
CPC ...... *H01L 27/14654* (2013.01); *H01L 31/1035* (2013.01); *H01L 31/1844* (2013.01); *H01L 31/1868* (2013.01); *H01L 27/14609* (2013.01); *H01L 27/14649* (2013.01);
(Continued)

(58) Field of Classification Search
CPC ............. H01L 27/14654; H01L 31/1035; H01L 31/1844; H01L 31/1868; H01L 27/14609; H01L 27/14649; H01L 27/1465; H01L 27/14689; H01L 27/14694; H01L 27/14683
See application file for complete search history.

(56) References Cited

U.S. PATENT DOCUMENTS 4,396,443 A   8/1983   Lewerenz et al.
5,053,837 A   10/1991  Tonai
(Continued)

FOREIGN PATENT DOCUMENTS

EP   1354360        8/2002
FR   2819941 A1     7/2002

OTHER PUBLICATIONS

Aierken A. et al.; "Comparison of epitaxial thin layer GaN and InP passivations on InGaAS/GaAs near-surface quantum wells"; Applied Physics Letters; 88, 221112 (2006).
(Continued)

*Primary Examiner* — Long Pham
(74) *Attorney, Agent, or Firm* — Blakely Sokoloff Taylor & Zafman (57) ABSTRACT

The invention relates to an InGaAs photodiode array (101) and to the method for manufacturing same, wherein said array includes: a cathode including at least one indium-phosphide substrate layer (4) and an active gallium-indium arsenide layer (5); and a plurality of anodes (3) at least partially formed in the active gallium-indium arsenide layer by diffusing a P-type dopant, the interaction between an anode (3) and the cathode forming a photodiode. According to said method, an indium-phosphide passivation layer (6) is arranged on the active layer before the diffusion of the P-type dopant forming the anodes (3), and a first selective etching is performed so as to remove, over the entire thickness thereof, an area (10) of the passivation layer (6) surrounding each anode (3).

9 Claims, 6 Drawing Sheets (52) U.S. Cl.
CPC ..... *H01L 27/1465* (2013.01); *H01L 27/14689* (2013.01); *H01L 27/14694* (2013.01); *Y02E 10/544* (2013.01); *H01L 27/14683* (2013.01)

(56) References Cited

U.S. PATENT DOCUMENTS

| | | |
|---|---|---|
| 2003/0173571 A1 | 9/2003 | Kish, Jr. et al. |
| 2005/0040415 A1 | 2/2005 | Kish, Jr. et al. |
| 2005/0184308 A1 | 8/2005 | Dutta |
| 2006/0105554 A1 | 5/2006 | Inada |
| 2010/0051809 A1 | 3/2010 | Onat et al. |

OTHER PUBLICATIONS

Toshihiro Kita et al.; "Development of Integration Process of InGaAs/InP Heterojunction Bipolar Transistors with InP-Passivated InGaAs pin Photodiodes"; International Conference on Indium Phosphide and Related Materials; May 18, 2007 Matsue, Japan.

INGAAS PHOTODIODE ARRAY

FIELD OF THE INVENTION

The invention relates to photodiode arrays, and more particularly to photodiode arrays based on indium-gallium arsenide (InGaAs) and indium phosphide (InP), as well as to their manufacturing process.

BACKGROUND OF THE INVENTION

One of the methods for manufacturing photodiodes in semiconductor materials with a small band gap (often for infrared light detection) consists of inserting the detection active small band gap layer between two large gap semiconductor materials. Both large band gap semiconductor layers are an efficient protection/passivation while remaining transparent to the wavelength of the radiation intended to be detected by the photodiode.

Further, with suitable dopings, both heterojunctions between the active layer and the two protection/passivation layers confine photoelectric charges in the active detection layer and improve the quantum yield of the thereby built photodiode.

An InGaAs photodiode is a typical example of this critical structure. The detection active layer consisting of InGaAs material may have an adjustable band gap depending on the indium, and gallium composition in InGaAs, ideal for operating in the SWIR (Short Wave Infra-Red) band of the order of 1.4 to 3 µm.

Indium phosphide and indium-gallium arsenide have the same face centered cubic crystalline structure. The most used composition is $In_{0.53}Ga_{0.47}As$. The crystalline lattice size is then comparable with that of the InP substrate, notably the lattice parameters. This crystalline compatibility allows growth by epitaxy of an active InGaAs layer of excellent quality on an InP substrate. The band gap of $In_{0.53}Ga_{0.47}As$ is of about 0.73 eV, capable of detecting up to a wavelength of 1.68 µm in the SWIR band. It has a growing benefit in fields of applications such as spectrometry, night vision, sorting of used plastics, etc.

Both protection/passivation layers are generally made in InP. Especially as the composition $In_{0.53}Ga_{0.47}As$, has the same crystalline lattice size as InP, this allows a very low darkness current from room temperature onwards.

Figure 1:
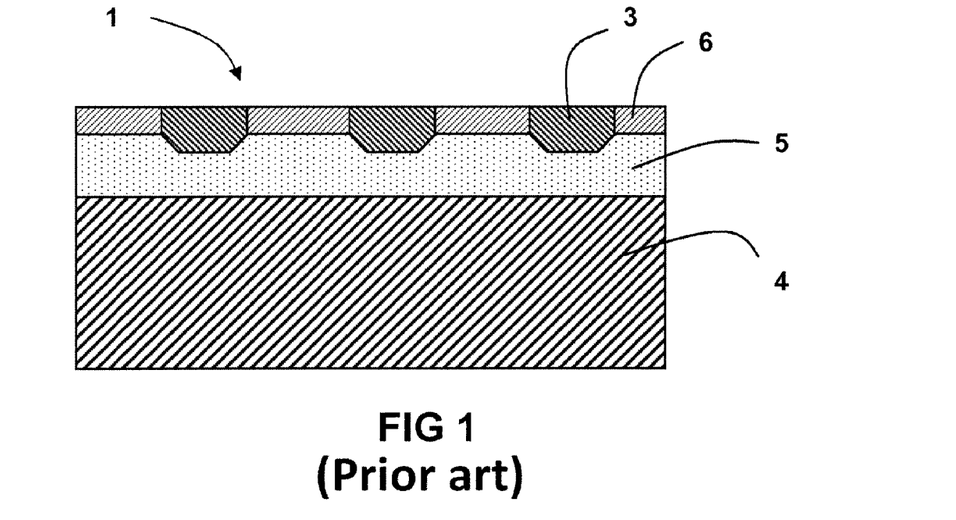
FIG. 1, having already been commented on, is a diagram illustrating the structure of an array of InGaAs photodiodes of the state of the art.

FIG. 1 illustrates the physical structure of an array 1 of photodiodes. An active layer 5 consisting of InGaAs is sandwiched between two InP layers. The lower layer actually forms the substrate 4 on which the InGaAs layer is formed by complex MO-CVD epitaxy. This InGaAs layer is then protected by a thin passivation layer 6 consisting of InP, also deposited by epitaxy. the InP layers are generally of the N type, doped with silicon. The active layer 5 of InGaAs may be slightly N-doped or may remain quasi-intrinsic. So both lower/upper InP layers and the active InGaAs layer 5 form the common cathode of the photodiodes in this array.

The individual anodes 3 are formed by local diffusion of zinc (Zn). The dopant Zn crosses the thin passivation InP layer 6 and penetrates into the active InGaAs layer 5.

Figure 2:
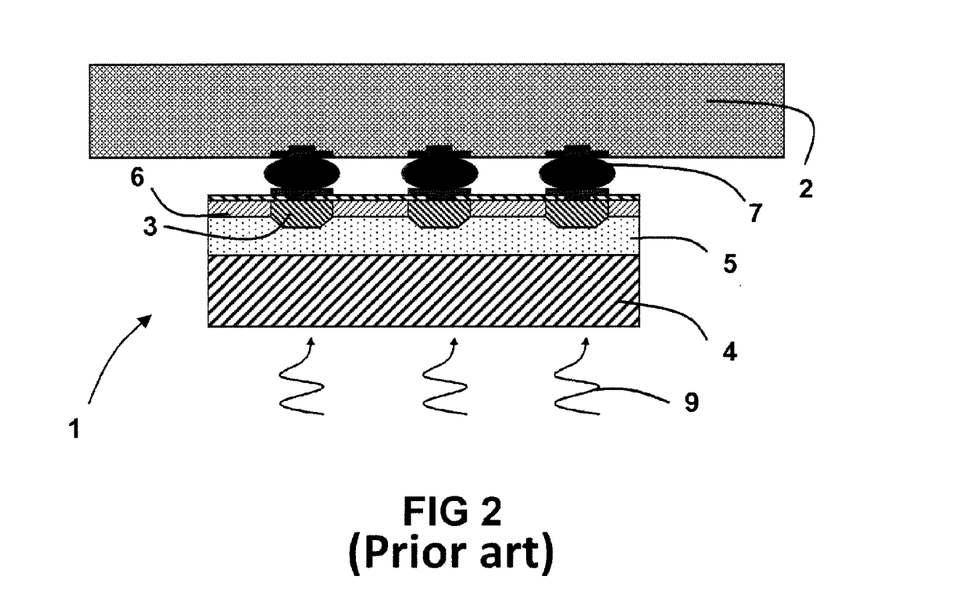
FIG. 2, having already been commented on, illustrates an InGaAs image sensor consisting of an array of InGaAs photodiodes, flip-chip connected with a readout circuit on a readout silicon substrate.

FIG. 2 illustrates an InGaAs image sensor consisting of an array 1 of InGaAs photodiodes connected in a flip-chip mode with a readout circuit 2. In an InGaAs array sensor, the photodiode array is connected to a readout circuit generally made in silicon in order to read the photoelectric signals generated by the InGaAs photodiodes. This interconnection is generally achieved with the flip-chip process via indium beads 7, as illustrated in FIG. 2. The SWIR radiation 9 arrives on the photodiode array through the indium phosphide substrate 4, transparent in this optical band.

With a detector operating in an integration mode, an output signal is obtained proportional to the product of the flux and of the exposure time. However, the output signal is limited by the maximum integration capability of the sensor. For scenes with high contrast, it is often impossible to obtain good rendering of dark areas and at the same time to keep bright areas without any saturation. This problem is all the more serious for night vision for which an array sensor with InGaAs photodiodes is often intended.

Figure 3:
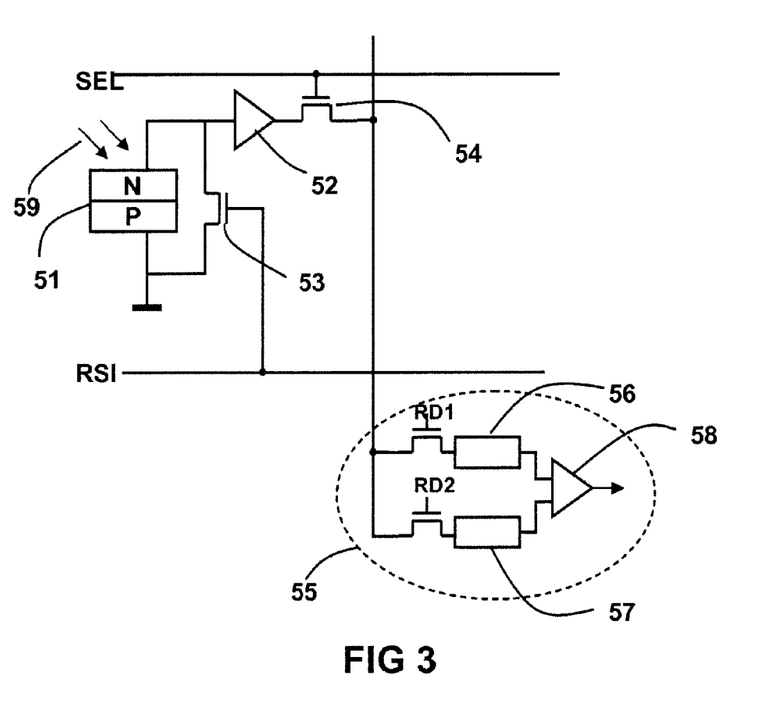
FIG. 3, already having been commented on, is a block diagram for making a logarithmic sensor with photodiodes in a solar cell mode.

Another way of reading the photoelectric signals from photodiodes, in a general way, is proposed by document EP 1 354 360 and illustrated in its principle by FIG. 3 of the drawings appended herein. Document EP 1 354 360 proposes a solar cell operating mode of a photodiode in order to obtain a logarithmic response versus the intensity of the incident optical radiation 59.

In this operating mode, the photodiode 51 does not receive any external bias and it is forward-biased by the photoelectric charges generated in its junction. The direct bias voltage observed on the photodiode is proportional to the logarithm of the incident light flux.

This logarithmic response gives the possibility of covering without any electrical and optical adjustment, an operating dynamic range of more than 120 dB, indispensable for using a SWIR InGaAs sensor under natural conditions outdoors. Document EP 1 354 360 also proposes association of a switching readout circuit 55 with the photodiode.

The principle of use of the image sensor array illustrated in FIG. 3 is the following:

a) The selection signal SEL is enabled in order to select the desired photodiode 51 by closing the switch 54. Once this photodiode is selected, the first readout signal RD1 is enabled which will close the corresponding controlled switch with the purpose of storing in memory the voltages from a first readout in the memory 56. This first readout records both the image and fixed spatial noise.

b) The reset signal RSI is then enabled, a signal will cause closing of the switch 53. The photodiode 51 thus being short-circuited, a reference image in absolute darkness is thus simulated.

c) The first readout signal RD1 is then disabled in order to reopen the corresponding switch and the second readout signal RD2 is then enabled for thus recording in the memory element 57 the voltages of the second readout. The fixed spatial noise has thus been stored in memory alone.

d) The difference between the result of both memory storages contained in the respective memory elements 56 and 57 is then calculated by a differential amplifier 58. The output signal of this amplifier 58 then corresponds to an image free of fixed spatial noise.

By means of the second readout, zero voltage corresponding to the darkness condition is generated. This electronic darkness signal gives the possibility of suppressing signal offsets in the readout chain in an array detector.

The principle proposed by EP 1 354 360 was applied in an InGaAs sensor and operates perfectly. But a blooming phenomenon is observed for daylight scenes. This phenomenon may simply be described as a loss of spatial resolution in an image. The detector nevertheless continues to be sensitive to variation of light according to the logarithmic law. This phenomenon is not observed in other types of photodiodes such as those based on silicon, InSb or MCT.

PRESENTATION OF THE INVENTION

The present invention proposes a simple and efficient solution to this blooming phenomenon in an array of InGaAs photodiodes. The solution proposed by the present invention also allows an improvement in image quality in a conventional detector in an integration mode.

For this purpose, according to a first aspect, a method for manufacturing an array of photodiodes is proposed, comprising:
- a cathode comprising at least one indium phosphide substrate layer and one indium-gallium arsenide active layer, and
- a plurality of anodes formed at least partly in the active indium-gallium arsenide layer by diffusion of a dopant of the P type, the cooperation between the anode and the cathode forming a photodiode, the method comprising the following steps:
- an N-type indium phosphide passivation layer is made on the active layer before diffusion of the dopant of the P type forming the anodes, and
- first selective etching of the passivation layer is achieved in order to selectively suppress over the whole of its thickness, an area of said passivation layer surrounding each anode.

The invention according to the present aspect is advantageously completed by the following features, taken alone or in any one of their technically possible combinations:
- the first selective etching is chemical etching made with a first selective chemical etching agent;
- the selective chemical etching agent is a solution of hydrochloric acid and of phosphoric acid;
- the method further comprises a subsequent passivation step by N-type doping of the etched areas of the indium phosphide passivation layer and of the indium-gallium arsenide active layer exposed by the first selective etching;
- the method further comprises a subsequent step for a second selective etching selectively suppressing over the whole of its thickness an area of the active layer surrounding each anode;
- the second selective etching is a chemical etching made with a second selective chemical etching agent;
- the second selective etching chemical agent is an aqueous solution comprising sulfuric acid and hydrogen peroxide;
- the second etching is followed by a subsequent passivation step by N-type doping of the etched areas of the indium phosphide passivation layer and of the indium-gallium arsenide active layer exposed by the first selective etching and by the second selective etching.

Preferably the doping depth N is comprised between 0.5 μm and 2 μm.

According to a second aspect, the invention also relates to an array of photodiodes comprising:
- a cathode comprising at least one indium phosphide substrate layer and an indium-gallium arsenide active layer,
- a plurality of anodes at least partly formed in the active layer, by the diffusion of a P-type dopant, the cooperation between the anode and the cathode forming a photodiode,
- an N-type indium phosphide passivation layer in which the anodes are at least partly formed by diffusion of a P-type dopant, and in that the array of photodiodes includes areas surrounding each anode in which said passivation layer is absent over the whole of its thickness.

The invention according to the second aspect is advantageously completed by the following features, taken alone or in any of their technically possible combinations:
- the array of photodiodes includes areas surrounding each anode in which said indium-gallium arsenide active layer is absent over the whole of its thickness.
- the array of photodiodes includes regions of the passivation layer and of the active layer in contact with said areas surrounding each anode, which are passivated by a doping of type N.

The invention also relates according to a third aspect to an image sensor incorporating a readout circuit and an array of photodiodes according to a second aspect. Preferably, the readout circuit is a logarithmic circuit.

SHORT DESCRIPTION OF THE FIGURES

Other aspects, objects and advantages of the present invention will become better apparent upon reading the detailed description which follows. The invention will also be better understood with reference to this description considered together with the appended drawings, given as non-limiting examples and wherein.

DETAILED DESCRIPTION

Figure 4:
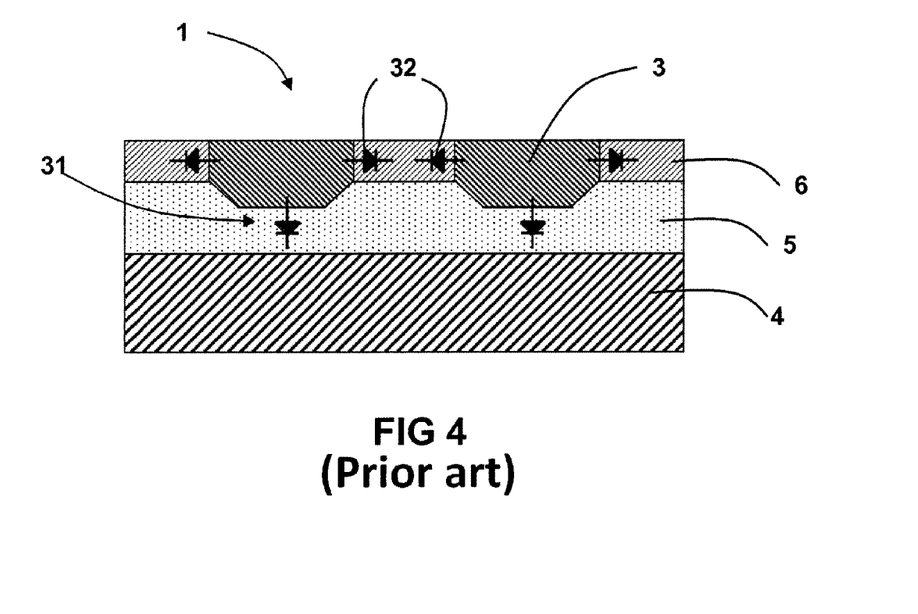
FIG. 4 illustrates the different junctions in an array of photodiodes of the state of the art.

In a structure of the state of the art as illustrated by FIG. 1, it may be seen that each photodiode contains several PN junctions, including an intended one and a certain number of which are parasitic junctions. These PN junctions are illustrated by FIG. 4. The PN junctions 31 between the anodes 3 and the active layer 5 are intended and form the diodes of the array of photodiodes.

The lateral parasitic PN junctions 32 between the anodes 3 and the passivation layer 6 form a possible electric flow path between the neighboring photodiodes via the passivation layer.

A conventional readout circuit integrates, in a capacitor, the reverse current in the photodiode by applying a reverse bias to the latter. In this configuration, the lateral parasitic junctions 32 in the photodiodes are reverse-biased at the same time with the effect of adding an additional parasitic current in the integration capacitor. This parasitic current degrades the image quality, but does not quasi-generate any cross-talk between the neighboring photodiodes. These parasitic currents may be partly compensated for by complex image processing operations on the raw image coming from the readout circuit.

When a photodiode operates in the solar cell mode, the junction is forward-biased by the incident light. In this case, the lateral parasitic junction 32 are also forward biased and they form a passage for electric current between neighbouring photodiodes. This forward-biasing becomes all the more significant since the incident light intensity increases, thereby generating a blooming phenomenon which considerably degrades the spatial resolution of the sensor.

The present invention proposes a structure allowing suppression of lateral conductivity in an array of InGaAs photodiodes. An array of photodiodes manufactured according to the present invention may be used in a solar cell mode as described in document EP 1 354 360, without any loss of spatial resolution, even in the presence of very strong light intensity. Such an array also provides improvement in the image quality with a conventional readout circuit in an integration mode, such as for example the different readout circuits CMOS ISC9705 and ISC9809 marketed by Indigo/FLIR in the USA. The circuit ISC9705 integrates the photoelectric current from a photodiode directly on a capacitor (direct injection mode) and circuit ISC9809 integrates the photoelectric current through an operational amplifier (CTIA mode). The CTIA mode allows a more significant charge-voltage conversion gain which promotes detection sensitivity.

Figure 5:
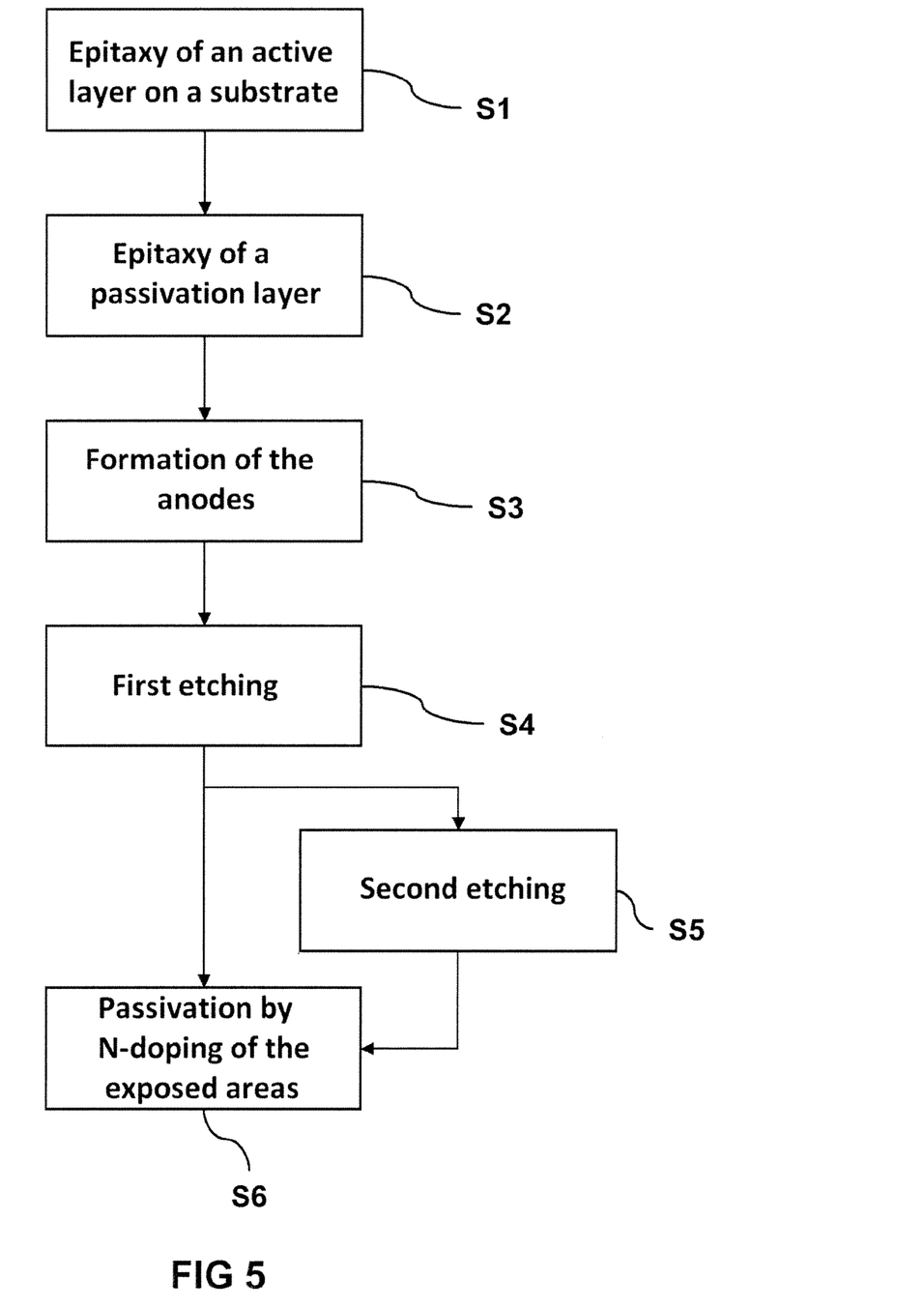
FIG. 5 is a block diagram illustrating manufacturing method according to the invention.

FIG. 5 is a block diagram illustrating the method for manufacturing an array of photodiodes according to the invention. After obtaining a photodiode array structure, for example by:
  epitaxial growth (step S1) of an active indium-gallium arsenide layer 5 on a substrate 4 of indium phosphide,
  epitaxial growth (step S2) of a passivation layer 6 of N-type indium phosphide on the active layer 5,
  formation (step S3) of the anode 3 by selective diffusion of zinc as a P-type dopant into the passivation layer 6 and the active layer 5,
  first selective etching is applied (step S4) in order to suppress on the whole of its thickness an area 10 of the passivation layer 6 surrounding each anode 3. This first selective etching selectively suppresses the passivation layer 6 as far as the active layer 5.

The InP layers are of type N, doped with silicon. The active layer 5 of InGaAs may be slightly N-doped or may remain quasi-intrinsic. Therefore the two lower/upper InP layers and the active InGaAs layer 5 form the common cathode of the photodiodes in this array.

Figure 6:
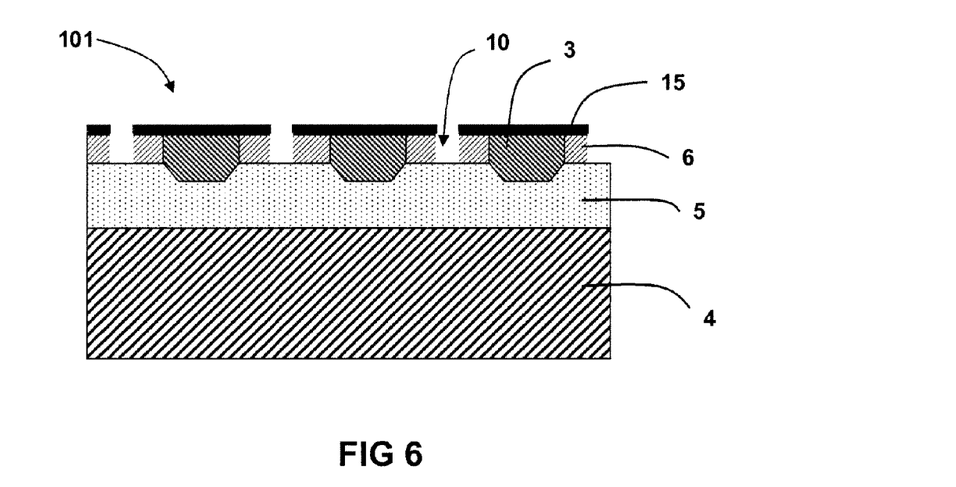
FIG. 6 is a diagram illustrating the structure of an array of photodiodes in which an area of the passivation layer surrounding each anode has been suppressed by first selective etching.

FIG. 6 is a diagram illustrating the structure of an array 101 of photodiodes in which an area 10 of the passivation layer 6 surrounding each anode has been suppressed by this first selective etching. A mask 15 is applied in order to define the areas 10 of the passivation layer 6 to be suppressed by the first etching. The array of photodiodes thus includes areas surrounding each anode in which the passivation layer 6 is absent over the whole of its thickness.

Suppressing by the first etching, at each anode 3, an area 10 of the passivation layer 6 surrounding each of said anodes 3 gives the possibility of suppressing the lateral electric passage between neighboring anodes 3 formed by neighboring Zn dopings.

This first etching is preferably chemical etching, achieved by means of a first selective chemical etching agent, preferably a solution of hydrochloric acid and of phosphoric acid, of formula $HCl:H_3PO_5$.

The $HCl:H_3PO_5$ solution allows selective dissolution of the passivation layer 6 consisting of indium phosphide InP and etching to be stopped upon reaching the active layer 5 consisting of indium-gallium arsenide InGaAs. By this etching selectivity, suppression of the passivation layer 6 may be obtained in a simple way.

The area 10 of the passivation layer 6 surrounding each of the anodes 3, to be suppressed, does not have to be large and may be limited to the accuracy of the lithography. Therefore, this area 10 may be kept quite far away from the Zn diffusion forming an anode 3, in which is found the region for capturing photoelectric charges. Thus, preferably, the first selective etching suppresses an area 10 sufficiently far away from the anodes 3 so that this first selective etching does not reach the PN junction between the anode 3 of type P and the passivation layer 6 of type N.

This first etching is preferably chemical etching but it may optionally be dry etching, for example plasma etching. Chemical etching is however preferred since it does not cause any physical damages in the etching area. In every case, the defects generated by this first etching only have a small impact on the darkness current of the photodiode, since they are sufficiently distant from the diffusion areas of the zinc.

Passivation based on an insulator such as silicon nitride $SiN_x$ or silicon dioxide $SiO_2$ may be applied following this etching. However, passivation based on an insulator does not allow sufficient reduction in the number of interface defects.

Figure 7:
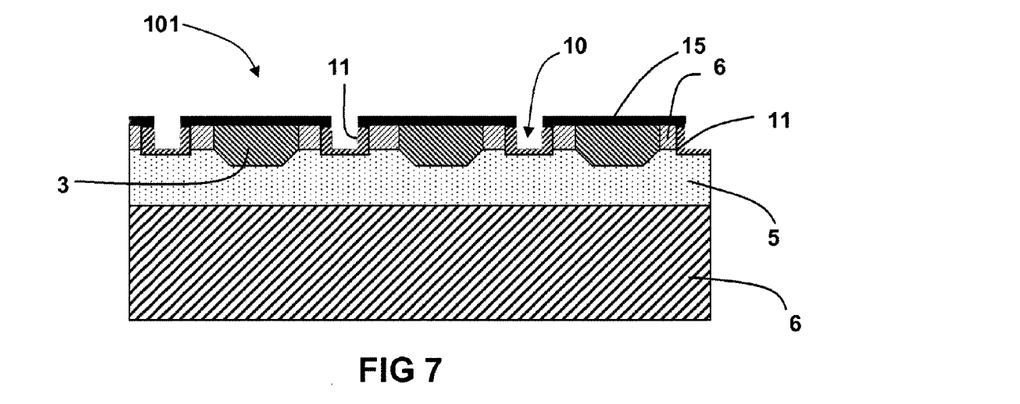
FIG. 7 is a diagram illustrating the passivation of the areas etched by the first selective etching by N-type doping of the exposed areas.

Therefore, passivation is preferably applied (step S6) by N-type doping of the etching areas 11 of the passivation layer 6 and of the active layer 5 exposed by the first etching. The structure after this N doping is illustrated by FIG. 7, in which the regions 11 of the passivation areas 6 and of the active layer 5 in contact with the areas 10 surrounding each anode are passivated by a doping of type N.

The N-doping depth of said regions 11 may be controlled between 0.5 µm and 2 µm, notably depending on the type of etching, either chemical or dry etching, and on the size of the photodiode. The surface generation is rapidly recombined in the N doping region. The heterojunction formed by this N doping inside the active InGaAs layer 5 repels the photoelectric charges towards the Zn diffusion area, i.e. the capture area. Therefore the quantum yield is thereby improved.

A doping of type P on the surfaces exposed by the etching forms a parasitic junction which drains the photoelectric charges towards the exposed surface. If the surface generation of electron/hole pairs is confined, the quantum yield suffers from this drainage towards the surface through this parasitic junction. Thus, passivation is advantageously carried out by means of N-type doping rather than P-type doping.

Preferably, prior to this passivation by N-type doping, second selective etching is applied, suppressing over the whole of its thickness an area 20 of the active layer 5 surrounding each anode (step S5), being aware that after the first etching of the passivation layer 6, the active layer 5 is exposed at areas 10 surrounding each of the anodes, as illustrated by FIG. 6. This second selective etching selectively suppresses the active layer 5 as far as the substrate 4, at the areas of the active layer exposed by the first etching. Further, preferably, the second selective etching suppresses an area 20 sufficiently away from the anode 3 so that this first selective etching does not reach the PN junction between the anode 3 of type P and the cathode consisting of the passivation layer 6 and of the active layer 5, of type N.

Indeed, selective suppression of areas of the passivation layer 6 around each anode 3 of a photodiode suppresses lateral conductivity between neighboring photodiodes. But lateral propagation of the photoelectric charges in the active indium-gallium arsenide InGaAs layer 5 may also degrade the spatial resolution of a sensor incorporating such a photodiode array. Partial suppression of the InGaAs active layer 5 around the Zn diffusion may be highly beneficial for the spatial resolution of the InGaAs sensor.

This second etching, which suppresses over the whole of its thickness a crown 20 of the active layer 5 in indium-gallium arsenide InGaAs around the Zn diffusion, is also preferably chemical etching and applied by means of a second selective chemical etching agent. For this second etching, an aqueous solution comprising sulfuric acid and hydrogen peroxide of formula $H_2SO_4:H_2O_2:H_2O$ is preferably used. Such a solution selectively etches only the active layer 5 consisting of indium-gallium arsenide InGaAs but preserves indium phosphide making up the passivation layer 6 and the substrate 4.

Figure 8:
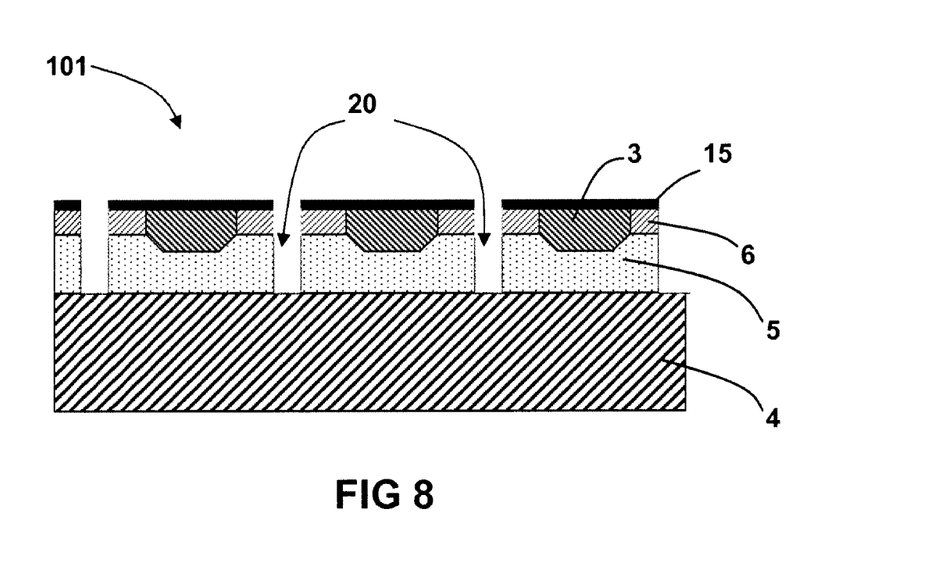
FIG. 8 is a diagram illustrating the structure of an array of photodiodes in which one area of the passivation layer and of the active layer surrounding each anode has been suppressed by first and second selective etchings.

Thus, each photodiode may be completely insulated from the others. FIG. 8 shows an array 101 of photodiodes resulting from the second etching. The array 101 of photodiodes then includes areas 20 surrounding each anode in which said active layer 5 in indium-gallium arsenide is absent over the whole of its thickness.

Further, this second etching by means of $H_2SO_4:H_2O_2:H_2O$ is beneficial for forming a thin layer protecting the structure against ambient oxidation.

Similarly to the foregoing, if this second etching is preferably chemical etching, it may optionally be dry etching, for example plasma etching. Chemical etching is however preferred since it does not cause any physical damages in the etching area. In every case, the defects generated by the second etching have little impact on the darkness current of the photodiode, since they are sufficiently distant from the zinc diffusion areas.

Passivation based on an insulator such as silicon nitride $SiN_x$ or silicon dioxide $SiO_2$ may be applied following this etching. However passivation based on an insulator does not allow sufficient reduction in the number of interface defects.

Thus, similarly to the one discussed above, passivation by N-doping of the etched areas of the passivation layer 6 and of the active layer 5 exposed by the first and second etchings is then applied (step S6).

Figure 9:
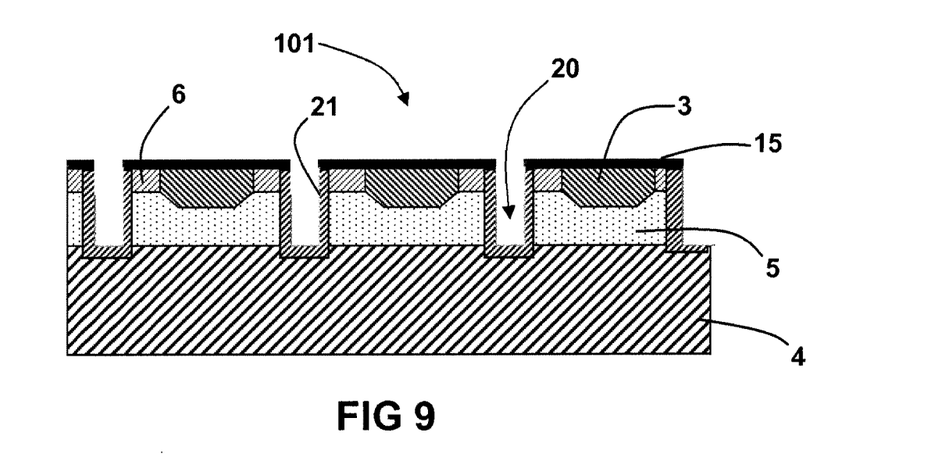
FIG. 9 is a diagram illustrating the passivation of the areas etched by the first and second etching by N-type doping of the exposed areas.

A photodiode array structure 101 of the type illustrated by FIG. 9 is then obtained, in which regions 21 of the passivation InP layer 6 and of the active InGaAs layer 5 in contact with the areas 20 surrounding each anode were passivated by doping of type N. Incidentally, it is also seen that an area of the substrate 4 exposed by the second etching was also passivated by doping of the N type.

Thus, an array 101 of photodiodes is obtained, each comprising:
  a cathode comprising at least one indium phosphide substrate layer 4 and an active indium-gallium arsenide layer 5 of the N type,
  a plurality of anodes 3 at least partly formed in the active layer 5 by diffusion of a dopant of type P, the cooperation between an anode 3 and the cathode forming a photodiode,
  with further an indium phosphide passivation layer 6 of type N in which are at least partly formed the anodes 3 by diffusion of a dopant of type P, including areas 10 surrounding each anode in which said passivation layer 6 is absent over the whole of its thickness.

Preferably, the array 101 has areas 20 surrounding each anode 3 in which said active layer 5 in indium-gallium arsenide is absent over the whole of its thickness.

Once the array of photodiodes is without any lateral conduction, the same manufacturing method for metallization and mounting as a chip turned upside down (flip-chip) with a readout circuit of a silicon substrate, may be found again.

Figure 10:
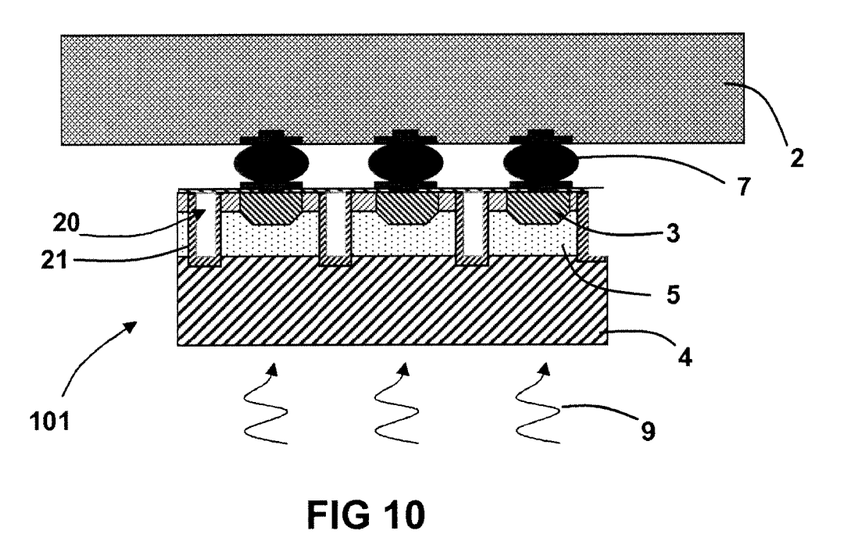
FIG. 10 illustrates an InGaAs image sensor consisting of an array of photodiodes according to the invention, flip-chip connected with a readout circuit on a silicon substrate.

FIG. 10 illustrates an InGaAs image sensor consisting of an array 101 of InGaAs photodiodes according to the invention, and more specifically similar to the one illustrated in FIG. 9, connected as a chip upside down with a readout circuit 2. In an InGaAs array sensor, the array of photodiodes is connected to a readout circuit made on a silicon substrate in order to read out the photoelectric signals generated by these InGaAs photodiodes. This interconnection is generally achieved by the flip-chip method via indium beads 7, as illustrated in FIG. 10. The SWIR radiation 9 arrives on the array of photodiodes through the indium phosphide substrate 4, transparent in this optical band.

Preferably, the readout circuit 2 is a logarithmic readout circuit as described above and discussed in FIG. 3.

The invention claimed is:

1. A method for manufacturing an array of photodiodes comprising:
  a cathode comprising at least one indium phosphide substrate layer and an indium-gallium arsenide active layer, and
  a plurality of anodes at least partly formed in the indium-gallium arsenide active layer by diffusion of a P-type dopant, the cooperation between the anodes and the cathodes forming a photodiode,
  wherein the method comprises the following steps:
  a passivation layer of indium-phosphide of type N on the active layer is made before diffusion of the P-type dopant forming the anode, and
  first selective etching of the passivation layer is achieved in order to selectively suppress over the whole of its thickness an area of said passivation layer surrounding each anode.

2. The manufacturing method according to claim 1, wherein the first selective etching is chemical etching made with a first selective chemical etching agent.

3. The manufacturing method according to claim 2, wherein the selective chemical etching agent is a solution of hydrochloric acid and phosphoric acid.

4. The manufacturing method according to claim 1, further comprising a subsequent passivation step by N-type doping of the etched areas of the indium phosphide passivation layer and of the indium-gallium arsenide active layer exposed by the first selective etching.

5. The manufacturing method according to claim 1, further comprising a subsequent second selective etching step selectively suppressing over the whole of its thickness an area of the active layer surrounding each anode.

6. The manufacturing method according to claim 5, wherein the second selective etching is chemical etching made with a second selective chemical etching agent.

7. The manufacturing method according to claim 6, wherein the second selective chemical etching agent is an aqueous solution comprising sulfuric acid and hydrogen peroxide.

8. The manufacturing method according to claim 5, comprising a subsequent passivation step by N-type doping of the etched areas of the indium phosphide passivation layer and of the indium-gallium arsenide active layer exposed by the first selective etching and by the second selective etching.

9. The manufacturing method according to one of claim 4, wherein the doping depth is comprised between 0.5 μm and 2 μm.

\* \* \* \* \*